US012796297B2

(12) United States Patent
Lee et al.

(10) Patent No.: US 12,796,297 B2
(45) Date of Patent: Nov. 10, 2026

(54) DISPLAY DEVICE AND METHOD OF PROVIDING THE SAME

(71) Applicant: Samsung Display Co., LTD., Yongin-si (KR)

(72) Inventors: Juhyun Lee, Yongin-si (KR); Hyuneok Shin, Yongin-si (KR); Yung Bin Chung, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 481 days.

(21) Appl. No.: 18/234,001

(22) Filed: Aug. 15, 2023

(65) Prior Publication Data

US 2024/0180006 A1 May 30, 2024

(30) Foreign Application Priority Data

Nov. 24, 2022 (KR) ........................ 10-2022-0159328

(51) Int. Cl.
*H10K 59/80* (2023.01)
*H10K 59/12* (2023.01)

(52) U.S. Cl.
CPC ..... *H10K 59/8791* (2023.02); *H10K 59/1201* (2023.02); *H10K 59/873* (2023.02)

(58) Field of Classification Search
CPC ......... H10K 2102/3023; H10K 50/865; H10K 50/844; H10K 50/8445; H10K 50/858; H10K 50/85; H10K 71/00; H10H 29/142; H10H 20/01; H10H 20/85; H10H 20/855
See application file for complete search history.

(56) References Cited

U.S. PATENT DOCUMENTS

| | | | |
|---|---|---|---|
| 2020/0373359 | A1 | 11/2020 | Lee et al. |
| 2021/0013455 | A1 | 1/2021 | Bae et al. |
| 2022/0157904 | A1 | 5/2022 | Yun et al. |

FOREIGN PATENT DOCUMENTS

| | | | |
|---|---|---|---|
| KR | 20200135130 | A | 12/2020 |
| KR | 20210033583 | A | 3/2021 |
| KR | 20220037524 | A | 3/2022 |

OTHER PUBLICATIONS

Extended European Search Report for Application No. 23201851.5-1212 dated Mar. 18, 2024.

*Primary Examiner* — Elmito Breval
(74) *Attorney, Agent, or Firm* — CANTOR COLBURN LLP

(57) ABSTRACT

A display device includes a substrate, a light transmission pattern disposed on the substrate, a capping layer covering the light transmission pattern, light control patterns disposed on the capping layer and contacting a side surface of the capping layer, and protective patterns contacting side surfaces of each of the light control patterns, respectively, and including a metal oxide.

19 Claims, 13 Drawing Sheets

DISPLAY DEVICE AND METHOD OF PROVIDING THE SAME

This application claims priority to Korean Patent Application No. 10-2022-0159328, filed on Nov. 24, 2022, and all the benefits accruing therefrom under 35 U.S.C. § 119, the content of which in its entirety is herein incorporated by reference.

BACKGROUND

1. Field

The disclosure relates to a display device and a method of providing the display device. More specifically, the disclosure relates to a display device which controls a viewing angle and a method for manufacturing the display device.

2. Description of the Related Art

A display device is a device that displays an image and includes a display area for displaying an image. Recently, demand for a display device, in which a viewing angle of an image displayed in a display area is controlled, is increasing.

Accordingly, a display device capable of controlling the viewing angle of an image displayed in a display area for privacy protection is being researched.

SUMMARY

Embodiments provide a display device which controls a viewing angle of a displayed image and has improved reliability.

Embodiments provide a method for manufacturing the display device.

A display device according to an embodiment includes a substrate, a light transmission pattern disposed on the substrate, a capping layer covering the light transmission pattern, light control patterns disposed on the capping layer and contacting a side surface of the capping layer, and protective patterns contacting side surfaces of each of the light control patterns, respectively, and including a metal oxide.

In an embodiment, the metal oxide of the protective patterns may be a transparent conductive oxide.

In an embodiment, the metal oxide of the protective patterns may be at least one selected from indium tin oxide (ITO), indium zinc oxide (IZO), indium tin zinc oxide (ITZO), indium gallium zinc oxide (IGZO), indium zinc gallium oxide (ITGO), and indium tin gallium zinc oxide (ITGZO).

In an embodiment, a width of each of the protective patterns may be less than a width of each of the light control patterns.

In an embodiment, the protective patterns may have a width in a range of about 100 angstroms to about 1000 angstroms.

In an embodiment, the protective patterns may expose an upper surface of the light transmission pattern.

In an embodiment, an etching rate of the protective patterns may be lower than an etching rate of the light control patterns in a same etching process.

In an embodiment, the capping layer may include at least one selected from silicon oxide, silicon nitride, and silicon oxynitride.

In an embodiment, the light control patterns may include molybdenum-tantalum oxide (MTO).

In an embodiment, the light control patterns may have a multi-layer structure of MTO/Mo, MTO/Cu, MTO/Al, MTO/Mo/MTO, MTO/Cu/MTO, or MTO/Al/MTO.

In an embodiment, the light transmission pattern may include a first light transmission pattern and a second light transmission pattern disposed adjacent to the first light transmission pattern and having a height greater than a height of the first light transmission pattern, and the capping layer may include a first capping layer covering the first light transmission pattern and a second capping layer covering a portion of the second light transmission pattern exposed through the first light transmission pattern.

In an embodiment, the light control pattern may include first light control patterns disposed on the first capping layer and contacting a side surface of the first capping layer and second light control patterns disposed on the second capping layer and contacting a side surface of the second capping layer.

In an embodiment, the protective patterns may include first protective patterns contacting side surfaces of the first light control patterns, respectively and second protective patterns contacting side surfaces of the second light control patterns, respectively.

In an embodiment, the first protective patterns may expose an upper surface of the first light transmission pattern, and the second protective patterns may expose an upper surface of the second light transmission pattern.

In an embodiment, a taper angle of the first light transmission pattern with respect to the substrate may be in a range of about 60 degrees to about 90 degrees.

In an embodiment, the display device may further include light emitting devices disposed on the substrate and an encapsulation layer covering the light emitting devices, and the light transmission pattern, the capping layer, the light control patterns, and the protective patterns may be disposed on the encapsulation layer.

A display device according to an embodiment includes a substrate, a light transmission pattern disposed on the substrate, light control patterns covering a side surface of the light transmission pattern, and protective patterns contacting side surfaces of each of the light control patterns, respectively, where the protective patterns include at least one metal oxide selected from indium tin oxide (ITO), indium zinc oxide (IZO), indium tin zinc oxide (ITZO), indium gallium zinc oxide (IGZO), indium zinc gallium oxide (ITGO) and indium tin gallium zinc oxide (ITGZO).

In an embodiment, the light control patterns and the protective patterns may expose an upper surface of the light transmission pattern.

In an embodiment, a width of each of the protective patterns may be less than a width of each of the light control patterns.

A method of manufacturing a display device according to an embodiment includes providing a first preliminary light transmission layer on a substrate, forming a first light transmission pattern by removing a portion of the first preliminary light transmission layer, providing a first capping layer covering the first light transmission pattern, providing a first preliminary light control layer covering the first capping layer, providing a first preliminary protective layer covering the first preliminary light control layer, forming first protective patterns contacting a side surface of the first preliminary light control layer by removing a portion of the first preliminary protective layer through a first etching process, and forming first light control patterns contacting a side surface of the first capping layer by removing a portion of the first preliminary light control layer exposed from the first protective patterns through a second etching process.

In an embodiment, the method may further include providing a second preliminary light transmission layer covering the first light transmission pattern, the first capping layer, the first light control patterns, and the first protective patterns after the forming the first light control patterns and the forming the first protective patterns, providing a second light transmission pattern having a height greater than a height of the first light transmission pattern by removing a portion of the second preliminary light transmission pattern layer, providing a second capping layer covering the second light transmission pattern, providing a second preliminary light control layer covering the second capping layer, providing a second preliminary protective layer covering the second preliminary light control layer, forming second protective patterns contacting a side surface of the second preliminary light control layer by removing a portion of the second preliminary protective layer through a third etching process, and forming second light control patterns contacting a side surface of the second capping layer by removing a portion of the second preliminary light control layer exposed from the second protective patterns through a fourth etching process.

In an embodiment, each of the first preliminary protective layer and the second preliminary protective layer may include at least one selected from indium tin oxide (ITO), indium zinc oxide (IZO), indium tin zinc oxide (ITZO), indium gallium zinc oxide (IGZO), indium zinc gallium oxide (ITGO), and indium tin gallium zinc oxide (ITGZO).

In an embodiment, each of the first to fourth etching processes may be anisotropic dry etching process.

In an embodiment, the first preliminary protective layer and the second preliminary protective layer may be formed through a sputtering process.

The display device according to embodiments may include the light control patterns. In such embodiment, the light control patterns may control or limit a viewing angle of light emitted from the light emitting device. In such an embodiment, the display device may include the protective patterns which are in contact with the light control patterns, respectively, and include a metal oxide. In an embodiment, for example, the protection patterns may contact side surfaces of each of the light control patterns, respectively. In such embodiments, the protective patterns may surround at least a portion of each of the light control patterns. Accordingly, damage to the light control patterns after a process of forming the light control patterns may be substantially reduced or effectively prevented. Accordingly, a reliability of the display device may be improved. Accordingly, the display device may effectively control the viewing angle.

In addition, according to the method of the display device according to the embodiments, before forming the light control patterns, the protective patterns including a metal oxide may be formed on the preliminary light control layer. The protective patterns may be formed to contact the side surface of the preliminary light control layer. Accordingly, in a process of forming the light control patterns by removing a portion of the preliminary light control layer, the side surface of the preliminary light control layer may be protected by the protective patterns. Accordingly, damage to the light control patterns which is remaining may be substantially reduced or effectively prevented. Accordingly, a reliability of the display device may be improved.

BRIEF DESCRIPTION OF THE DRAWINGS

Illustrative, non-limiting embodiments will be more clearly understood from the following detailed description taken in conjunction with the accompanying drawings.

DETAILED DESCRIPTION

Figure 1:
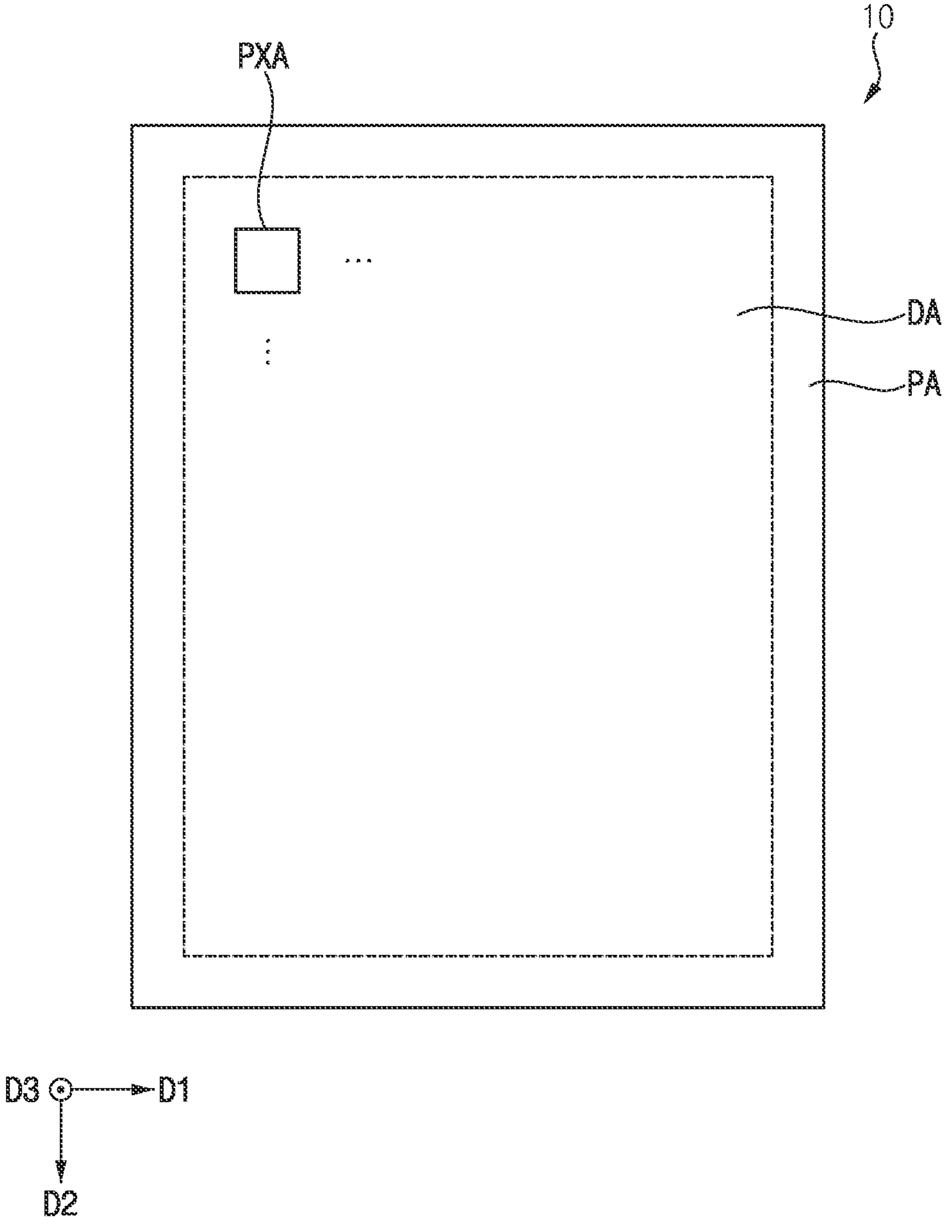
FIG. 1 is a plan view illustrating a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

FIG. 1 is a plan view illustrating a display device according to an embodiment.

Referring to FIG. 1, the display device 10 according to an embodiment may be divided into a display area DA and a peripheral area PA. The display area DA may display an image, and the peripheral area PA may be located around the display area DA. In an embodiment, for example, the peripheral area PA may surround the display area DA.

In an embodiment, the display device 10 may have a rectangular shape in a plan view. However, the invention is not necessarily limited thereto, and the display device 10 may have various shapes in a plan view. In this case, a plane on which a display surface of the display device 10 is disposed may be defined by a first direction D1 and a second direction D2 intersecting the first direction D1. The third direction D3 may be perpendicular to the plane. The third direction D3 may be referred to as a front direction or a thickness direction of the display device 10.

The display device 10 may include a plurality of pixel areas PXA defined in the display area DA. In an embodiment, for example, the pixel areas PXA may be arranged in a matrix form along the first direction D1 and the second direction D2.

Figure 2:
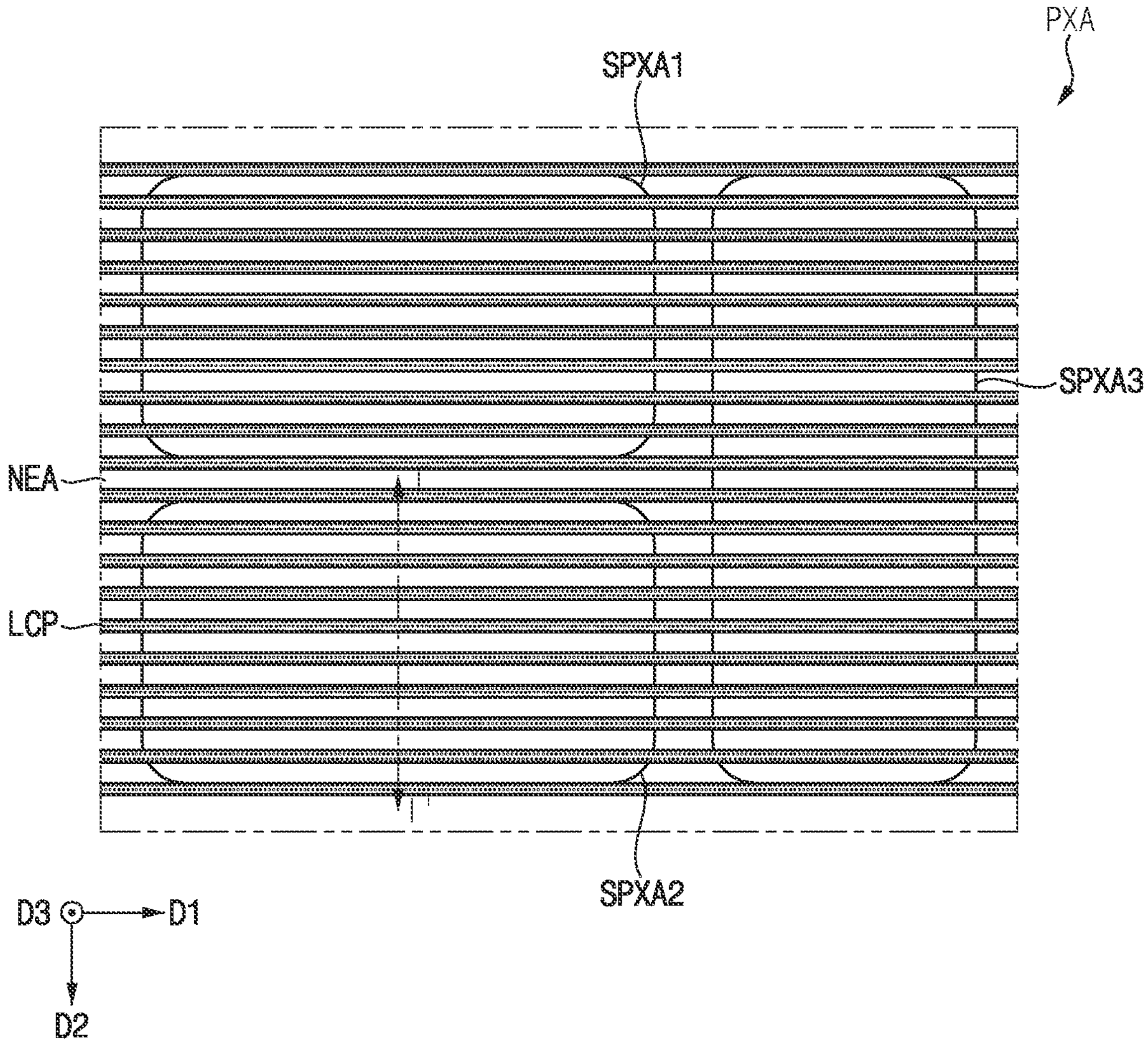
FIG. 2 is an enlarged view illustrating a pixel area of the display device of FIG. 1.

FIG. 2 is an enlarged view illustrating a pixel area of the display device of FIG. 1.

Referring to FIGS. 1 and 2, the pixel area PXA may include a plurality of sub-pixel areas SPXA1, SPXA2, and SPXA3 which emit light of different colors and include a non-emission area NEA surrounding the plurality of sub-pixel areas SPXA1, SPXA2, and SPXA3. In an embodiment, for example, the first sub-pixel area SPXA1 may emit red light, the second sub-pixel area SPXA2 may emit green light, and the third sub-pixel area SPXA3 may emit blue light. However, the invention is not necessarily limited thereto, and the first to third sub-pixel areas SPXA1, SPXA2, and SPXA3 may be combined so as that the pixel area PXA emits light of yellow, cyan, or magenta.

In an embodiment, an arrangement structure of the first to third sub-pixel areas SPXA1, SPXA2, and SPXA3 may be an S-stripe structure. In an embodiment, for example, the first sub-pixel area SPXA1 and the second sub-pixel area SPXA2 may be disposed in a first column, and the third sub-pixel area SPXA3 may be disposed in a second column adjacent to the first column. In this case, one side of each of the first sub-pixel area SPXA1 and the second sub-pixel area SPXA2 may face a long side of the third sub-pixel area SPXA3. However, this is only an example, and the arrangement of the first to third sub-pixel areas SPXA1, SPXA2, and SPXA3 in a plan view is not necessarily limited thereto.

In an embodiment, the display device 10 may include light control patterns LCP. The light control patterns LCP may extend in the first direction D1. In an embodiment, the light control patterns LCP may be arranged side by side with each other in a plan view. In an embodiment, for example, the light control patterns LCP may be spaced apart from each other in the second direction D2. In such an embodiment, the light control patterns LCP may be parallel to each other. However, an arrangement of the light control patterns LCP is not necessarily limited thereto.

The light control patterns LCP may control or limit a viewing angle of light emitted from each of the first to third sub-pixel areas SPXA1, SPXA2, and SPXA3. In an embodiment, the light control patterns LCP may be disposed to overlap the first to third sub-pixel areas SPXA1, SPXA2, and SPXA3. However, the invention is not necessarily limited thereto. In an embodiment, for example, the light control patterns LCP may be disposed to be spaced apart from the first to third sub-pixel areas SPXA1, SPXA2, and SPXA3 and overlap the non-emission area NEA. In such an embodiment, the light control patterns LCP may be disposed between the first to third sub-pixel areas SPXA1, SPXA2, and SPXA3. In addition, the light control patterns LCP may overlap some of the first to third sub-pixel areas SPXA1, SPXA2, and SPXA3 and may be spaced apart from the others.

Figure 3:
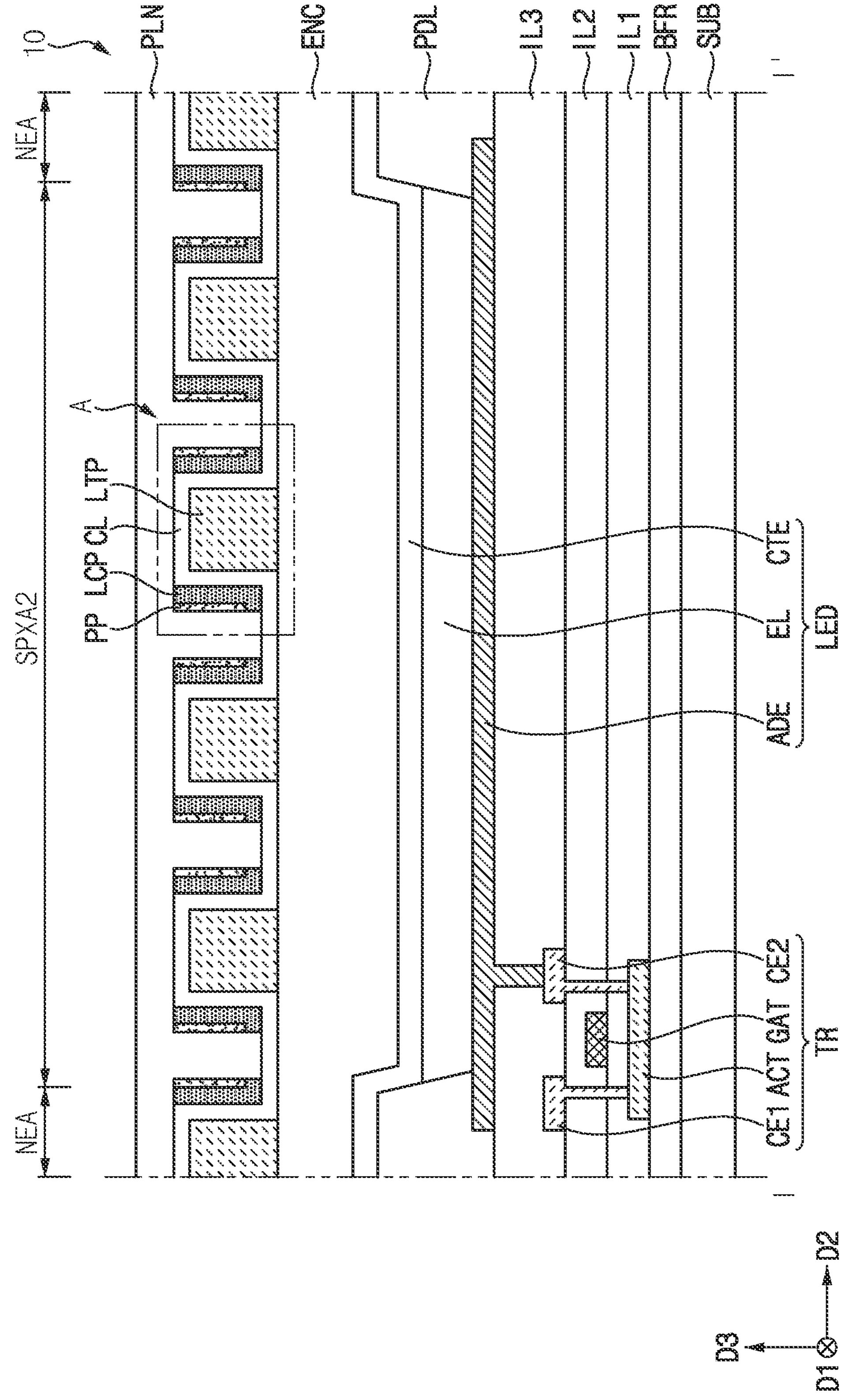
FIG. 3 is a cross-sectional view taken along line I-I' of FIG. 2.

FIG. 3 is a cross-sectional view taken along line I-I' of FIG. 2. In FIG. 3, only a cross-sectional structure of the second sub-pixel area SPXA2 is illustrated for convenience of illustration and description. A cross-sectional structure of each of the first sub-pixel area SPXA1 and the third sub-pixel area SPXA3 may be substantially the same as the cross-sectional structure of the second sub-pixel area SPXA2.

Referring to FIG. 3, an embodiment of the display device 10 may include a substrate SUB, a buffer layer BFR, a driving element TR, a plurality of insulating layers IL1, IL2 and IL3, a pixel defining layer PDL, a light emitting device LED, an encapsulation layer ENC, a light transmission pattern LTP, a capping layer CL, the light control patterns LCP, protective patterns PP, and a planarization layer PLN.

The driving element TR may include an active pattern ACT, a gate electrode GAT, a first connection electrode CE1, and a second connection electrode CE2. The light emitting device LED may include a pixel electrode ADE, an emission layer EL, and a common electrode CTE.

The substrate SUB may include a transparent or opaque material. In an embodiment, examples of materials that can be used as the substrate SUB may include glass, quartz, plastic, or the like. These may be used alone or in combination with each other.

The buffer layer BFR may be disposed on the substrate SUB. The buffer layer BFR may prevent or reduce diffusion of impurities such as oxygen, moisture, or the like to an upper portion of the substrate SUB through the substrate SUB. The buffer layer BFR may include an inorganic insulating material such as a silicon compound or a metal oxide. Examples of the inorganic insulating material that can be used as the buffer layer BFR may include silicon oxide, silicon nitride, or silicon oxynitride. These may be used alone or in combination with each other. The buffer layer BFR may have a single-layer structure or a multi-layer structure including a plurality of insulating layers.

Although not shown, in an embodiment, a barrier layer may be additionally disposed between the substrate SUB and the buffer layer BFR. The barrier layer may include an inorganic insulating material.

The active pattern ACT may be disposed on the buffer layer BFR. In an embodiment, the active pattern ACT may include a silicon semiconductor material or an oxide semiconductor material. Examples of the silicon semiconductor material that can be used as the active pattern ACT may include amorphous silicon, polycrystalline silicon, or the like. Examples of the oxide semiconductor material that can be used as the active pattern ACT may include InGaZnO (IGZO), InSnZnO (ITZO), or the like. In addition, the oxide semiconductor material may further include oxide of indium (In), gallium (Ga), tin (Sn), zirconium (Zr), vanadium (V), hafnium (Hf), cadmium (Cd), germanium (Ge), chromium (Cr), titanium (Ti), and zinc (Zn). These may be used alone or in combination with each other.

In an embodiment, the first insulating layer IL1 may be disposed on the buffer layer BFR. The first insulating layer IL1 may cover the active pattern ACT. In an alternative embodiment, the first insulating layer IL1 may be disposed in a pattern shape on the active pattern ACT to expose a portion of the active pattern ACT. In an embodiment, for example, the first insulating layer IL1 may be disposed on the active pattern ACT in a pattern shape to overlap the gate electrode GAT. The first insulating layer IL1 may include an inorganic insulating material. Examples of inorganic insulating material that can be used as the first insulating layer IL1 may include silicon oxide, silicon nitride, silicon oxynitride, or the like. These may be used alone or in combination with each other.

The gate electrode GAT may be disposed on the first insulating layer IL1. In an embodiment, the gate electrode GAT may include a metal, an alloy, a conductive metal oxide, a transparent conductive material, or the like.

The second insulating layer IL2 may be disposed on the first insulating layer IL1. In an embodiment, the second insulating layer IL2 may cover the gate electrode GAT. The second insulating layer IL2 may include an inorganic insulating material. Examples of inorganic insulating material that can be used as the second insulating layer IL2 may include silicon oxide, silicon nitride, silicon oxynitride, or the like. These may be used alone or in combination with each other.

The first connection electrode CE1 and the second connection electrode CE2 may be disposed on the second insulating layer IL2. The first connection electrode CE1 and the second connection electrode CE2 may be electrically connected to the active pattern ACT through a contact hole defined or formed in the second insulating layer IL2. Each of the first connection electrode CE1 and the second connection electrode CE2 may include a metal, an alloy, a conductive metal oxide, a transparent conductive material, or the like.

The third insulating layer IL3 may be disposed on the second insulating layer IL2. The third insulating layer IL3 may cover the first connection electrode CE1 and the second connection electrode CE2. The third insulating layer IL3 may include an organic insulating material. Examples of organic insulating material that can be used as the third insulating layer IL3 may include photoresist, polyacryl-based resin, polyimide-based resin, polyamide-based resin, siloxane-based resin, acrylic-based resin, epoxy-based resin, or the like. These may be used alone or in combination with each other. The third insulating layer IL3 may have a single-layer structure or a multi-layer structure including a plurality of insulating layers.

In such an embodiment, a configuration, an arrangement structure, and a connection structure of the driving element TR and a configuration, an arrangement structure, and a connection structure of the plurality of insulating layers IL1, IL2, and IL3 described with reference to FIG. 3 may be variously changed or modified.

The pixel electrode ADE may be disposed on the third insulating layer IL3. The pixel electrode ADE may be electrically connected to the driving element TR through a contact hole defined or formed in the third insulating layer IL3. In an embodiment, the pixel electrode ADE may include a metal, an alloy, a conductive metal oxide, a transparent conductive material, or the like.

The pixel defining layer PDL may be disposed on the third insulating layer IL3. The pixel defining layer PDL may define a pixel opening exposing a portion of the pixel electrode ADE. In an embodiment, the pixel defining layer PDL may include an organic insulating material. Examples of organic insulating material that can be used as the pixel defining layer PDL may include photoresist, polyacrylic resin, polyimide resin, acrylic resin, or the like. These may be used alone or in combination with each other.

The emission layer EL may be disposed on the pixel electrode ADE in the pixel opening. The emission layer EL may include a material which emits light. In an embodiment, for example, the emission layer EL may include an organic light emitting material.

In an embodiment, functional layers such as a hole injection layer, a hole transport layer, an electron transport layer, and an electron injection layer may be additionally disposed above and/or below the emission layer EL.

The common electrode CTE may be disposed on the emission layer EL. The common electrode CTE may include a conductive material such as a metal, an alloy, a conductive metal nitride, a conductive metal oxide, or a transparent conductive material. The common electrode CTE may have a single-layer structure or a multi-layer structure including a plurality of conductive layers. In an embodiment, the common electrode CTE may continuously extend (or commonly disposed) over a plurality of pixels.

The pixel electrode ADE, the emission layer EL, and the common electrode CTE may collectively define the light emitting device LED. In FIG. 3, an area where the light emitting device LED is defined may be the second sub-pixel area SPXA2 described with reference to FIG. 2. In an embodiment, as shown in FIG. 3, the second sub-pixel area SPXA2 may be an area corresponding to the pixel opening.

The encapsulation layer ENC may be disposed on the light emitting device LED. The encapsulation layer ENC may protect the light emitting device LED from external moisture, heat, shock, or the like. Although not shown, in an embodiment, the encapsulation layer ENC may include a first inorganic encapsulation layer, an organic encapsulation layer disposed on the first inorganic encapsulation layer, and a second inorganic encapsulation layer disposed on the organic encapsulation layer.

In an embodiment, the light transmission pattern LTP may be disposed on the encapsulation layer ENC. The light transmission pattern LTP may define an opening exposing an upper surface of the encapsulation layer ENC. The opening may be defined by a side surface of the light transmission pattern LTP. In such an embodiment, the opening may be defined through the light transmission pattern LTP. In an embodiment, the light transmission pattern LTP may have a grid shape in a plan view.

The light transmission pattern LTP may include an organic insulating material and/or an inorganic insulating material having relatively high light transmittance. In an embodiment, for example, the light transmission pattern LTP may include a siloxane-based material and/or a silica-based material.

In an alternative embodiment, a separate insulating layer may be additionally disposed between the encapsulation layer ENC and the light transmission pattern LTP. In such an embodiment, the light transmission pattern LTP may define an opening exposing an upper surface of the insulating layer which disposed between the encapsulation layer ENC and the light transmission pattern LTP.

The capping layer CL may cover the light transmission pattern LTP. In an embodiment, the capping layer CL may cover an upper surface of the light transmission pattern LTP, the side surface of the light transmission pattern LTP, and the encapsulation layer ENC. In an embodiment, the capping layer CL may include an inorganic material. Examples of inorganic material that can be used as the capping layer CL may include silicon oxide, silicon nitride, and silicon oxynitride, or the like. These may be used alone or in combination with each other.

The light control patterns LCP may be disposed on the capping layer CL. The light control patterns LCP may be disposed in the opening defined in the light transmission pattern LTP. In an embodiment, for example, the light control patterns LCP may contact (or disclosed directly on) a side surface of the capping layer CL. In such an embodiment, the light control patterns LCP may overlap the side surface of the light transmission pattern LTP. Accordingly, the light transmission pattern LTP may be disposed between the light control patterns LCP adjacent to each other. That is, the light control patterns LCP may expose the upper surface of the light transmission pattern LTP.

In an embodiment, light emitted from the light emitting device LED may be incident on the light control patterns LCP or may pass through an area between the light control patterns LCP. Some of the light incident on the light control patterns LCP may pass through the light control patterns LCP. Some of the light incident on the light control patterns LCP may be reflected by the light control patterns LCP. Some of the light incident on the light control patterns LCP may be absorbed by the light control patterns LCP.

In an embodiment, a reflectivity of the light control patterns LCP may be about 20% or less. In an embodiment, for example, the reflectivity of the light control patterns LCP may be in a range about 4% to about 8%. In an embodiment, a transmittance of the light control patterns LCP may be about 10% or less. In an embodiment, for example, the transmittance of the light control patterns LCP may be in a range of about 0.5% to about 1.5%. In such an embodiment, most of the light incident on the light control patterns LCP may be absorbed by the light control patterns LCP. Accordingly, the light control patterns LCP may control or limit a viewing angle of light emitted from the light emitting device LED.

In an embodiment, the light control patterns LCP may include molybdenum-tantalum oxide (MTO). In an embodiment, the light control patterns LCP may have a multi-layered structure. In an embodiment, for example, the light control patterns LCP may have a three-layer structure of MTO/Mo/MTO, MTO/Cu/MTO, or MTO/Al/MTO. Alternatively, the light control patterns LCP may have a two-layer structure such as MTO/Mo, MTO/Cu, or MTO/Al. However, the invention is not necessarily limited thereto, and in another alternative embodiment, the light control patterns LCP may have a single-layer MTO structure or may have a multi-layer structure of 4 or more layers. In addition, the light control patterns LCP may include various materials having relatively low transmittance and reflectance and relatively high absorbance other than molybdenum-tantalum oxide.

The protective patterns PP may be disposed on the light control patterns LCP. In an embodiment, the protective patterns PP may be disposed in the opening defined in the light transmission pattern LTP. In an embodiment, for example, the protective patterns PP may contact side surfaces of each of the light control patterns LCP, respectively. In an embodiment, for example, the protective patterns PP may surround at least a portion of each of the light control patterns LCP. The protective patterns PP may expose the upper surface of the light transmission patterns LTP.

In an embodiment, the protective patterns PP may include a metal oxide. In an embodiment, for example, the protective patterns PP may include a transparent conductive oxide. Examples of the metal oxide that can be used as the protective patterns PP may include indium tin oxide (ITO), indium zinc oxide (IZO), indium tin zinc oxide (ITZO), indium gallium zinc oxide (IGZO), indium zinc gallium oxide. (ITGO), indium tin gallium zinc oxide (ITGZO), or the like. These may be used alone or in combination with each other.

In an embodiment, light emitted from the light emitting device LED may be incident on the protective patterns PP or may pass an area between the protective patterns PP. Most of the light incident on the protection patterns PP may pass through the protection patterns PP. In an embodiment, for example, the protective patterns PP may have higher light transmittance than the light transmittance of the light control patterns LCP.

In an embodiment, an etching rate of the protective patterns PP may be lower than an etching rate of the light control patterns LCP in a same etching process. In an embodiment, the etching process may be a dry etching process.

The planarization layer PLN may cover the light transmission pattern LTP, the light control patterns LCP, the protection patterns PP, and the capping layer CL. The planarization layer PLN may have a substantially flat upper surface. The planarization layer PLN may be disposed while filling an empty space of the opening of the light transmission pattern LTP. In an embodiment, the planarization layer PLN may include a same material as the light transmission pattern LTP. In an embodiment, for example, the planarization layer PLN may include an organic insulating material and/or an inorganic insulating material having relatively high light transmittance.

Figure 4:
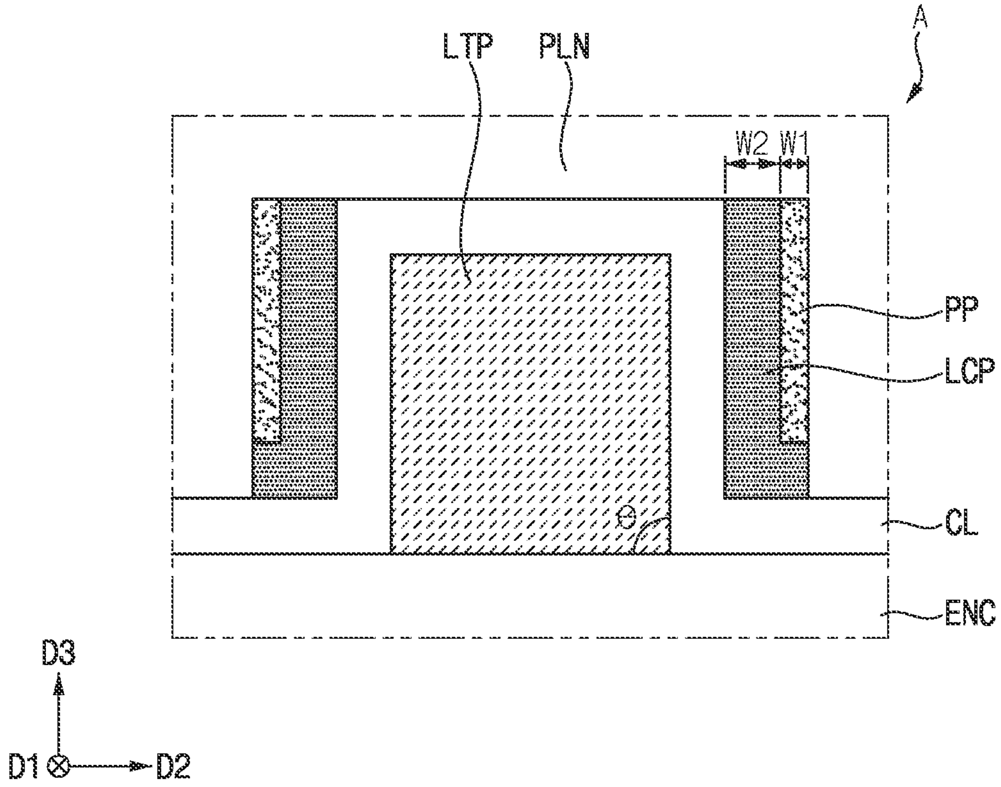
FIG. 4 is an enlarged view of an area A of FIG. 3.

FIG. 4 is an enlarged view of an area A of FIG. 3.

Referring to FIGS. 3 and 4, a first width (or thickness) W1 of each of the protective patterns PP may be less than a second width W2 of each of the light control patterns LCP. In an embodiment, the first width W1 of each of the protective patterns PP in the second direction D2 may be less than the second width W2 of each of the light control patterns LCP in the second direction D2.

In an embodiment, the first width W1 of each of the protective patterns PP may be about 1 micrometer or less. In an embodiment, for example, the first width W1 of each of the protective patterns PP may be about 100 angstroms to about 1000 angstroms, specifically, about 100 angstroms to about 500 angstroms.

In an embodiment, a taper angle θ of the light transmission pattern LTP with respect to the substrate SUB may be in a range of about 60 degrees to about 90 degrees. in an embodiment, an angle between an upper surface of the substrate SUB and the side surface of the light transmission pattern LTP may be in a range of about 60 degrees to about 90 degrees. In such an embodiment, an angle between an upper surface of the encapsulation layer ENC and the side surface of the light transmission pattern LTP may be in a range of about 60 degrees to about 90 degrees. In an embodiment, for example, as shown in FIG. 4, the taper angle θ of the light transmission pattern LTP may be about 90 degrees.

According to embodiments, the display device 10 may include the light control patterns LCP. The light control patterns LCP may control a viewing angle of light emitted from the light emitting device LED. In such embodiments, the display device 10 may include the protective patterns PP which are in contact with the light control patterns LCP, respectively, and include a metal oxide. In an embodiment, for example, the protection patterns PP may contact side surfaces of each of the light control patterns LCP, respectively. In such an embodiment, the protective patterns PP may surround at least a portion of each of the light control patterns LCP. Accordingly, after a process of forming the light control patterns LCP, damage to the light control patterns LCP may be substantially reduced or effectively prevented. Accordingly, a reliability of the display device 10 may be improved. Accordingly, the display device 10 may effectively control the viewing angle.

FIGS. 5 to 12 are cross-sectional views illustrating an embodiment of a method of manufacturing a light transmission pattern, light control patterns, and protective patterns included in the display device of FIG. 3.

Hereinafter, an embodiment of a method of manufacturing the light transmission pattern LTP, the light control patterns LCP, and the protective patterns PP will be described with reference to FIGS. 5 to 12.

Figure 5:
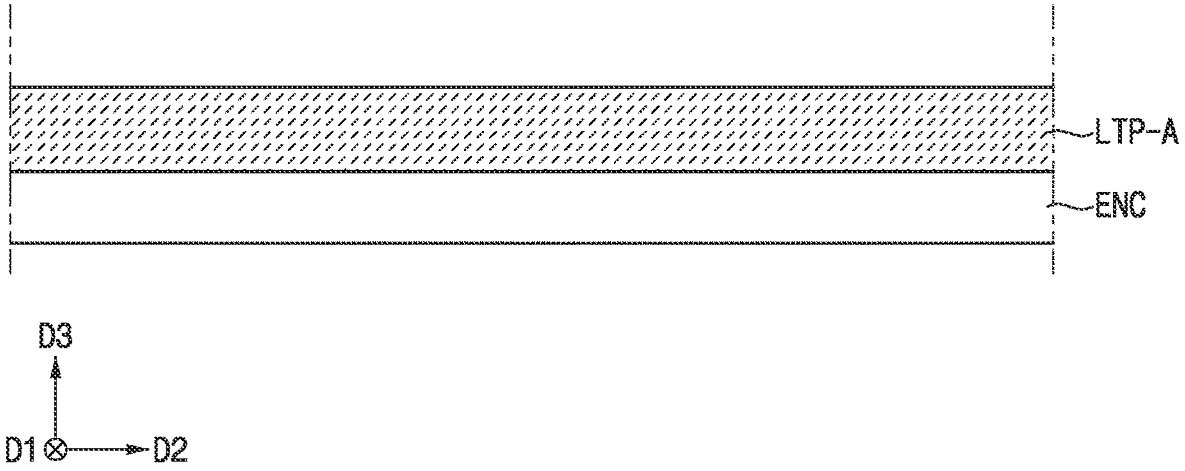
FIGS. 5 to 12 are cross-sectional views illustrating an embodiment of a method of manufacturing a light transmission pattern, light control patterns, and protective patterns included in the display device of FIG. 3.

Referring to FIG. 5, in an embodiment, a preliminary light transmission layer LTP-A may be provided or formed on the encapsulation layer ENC. The preliminary light transmission layer LTP-A may be formed of an organic insulating material and/or an inorganic insulating material having relatively high light transmittance.

Figure 6:
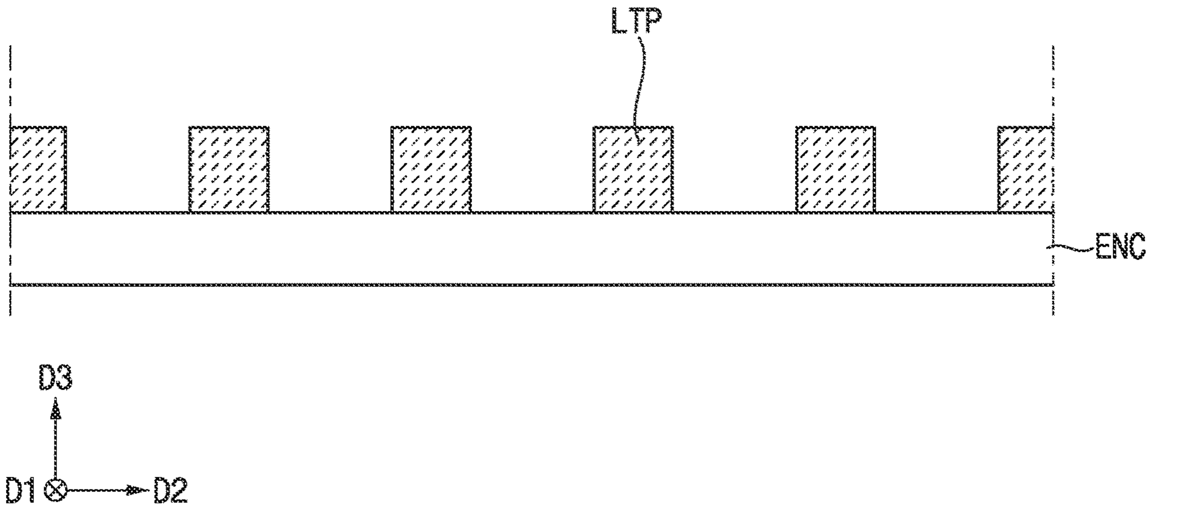

Further referring to FIG. 6, the light transmission pattern LTP may be formed by patterning the preliminary light transmission layer LTP-A through exposure and development processes. The light transmission pattern LTP, which is patterned, may define the opening exposing the encapsulation layer ENC. The opening may be defined by the side surface of the light transmission pattern LTP.

Figure 7:
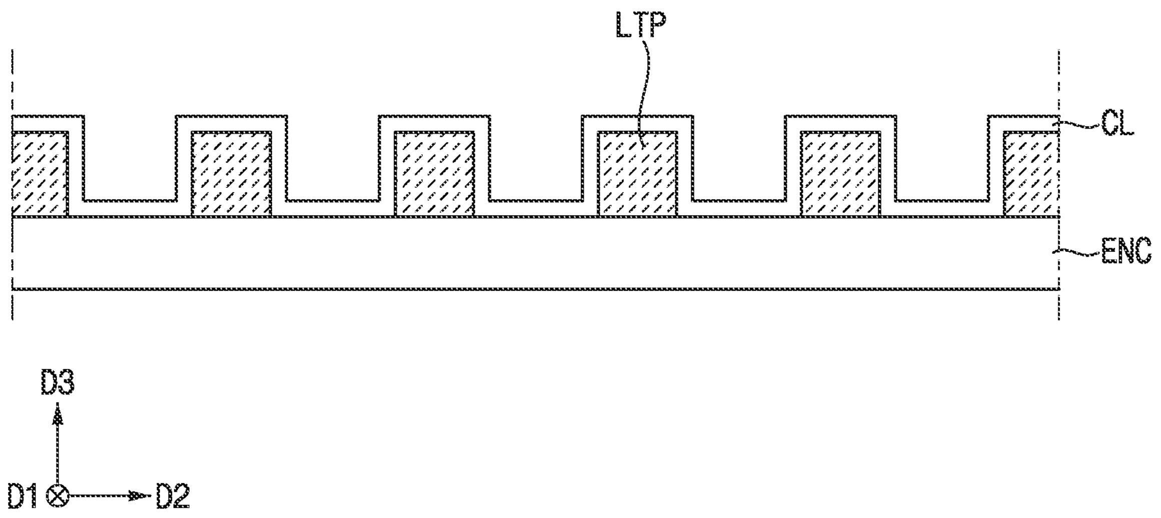

Referring to FIG. 7, the capping layer CL may be provided or formed on the light transmission pattern LTP and the encapsulation layer ENC. In an embodiment, the capping layer CL may be formed along a profile defined by the patterned light transmission pattern LTP on the encapsulation layer ENC. The capping layer CL may cover the light transmission pattern LTP and the encapsulation layer ENC. The capping layer CL may be formed of at least one selected from silicon oxide, silicon nitride, and silicon oxynitride.

Figure 8:
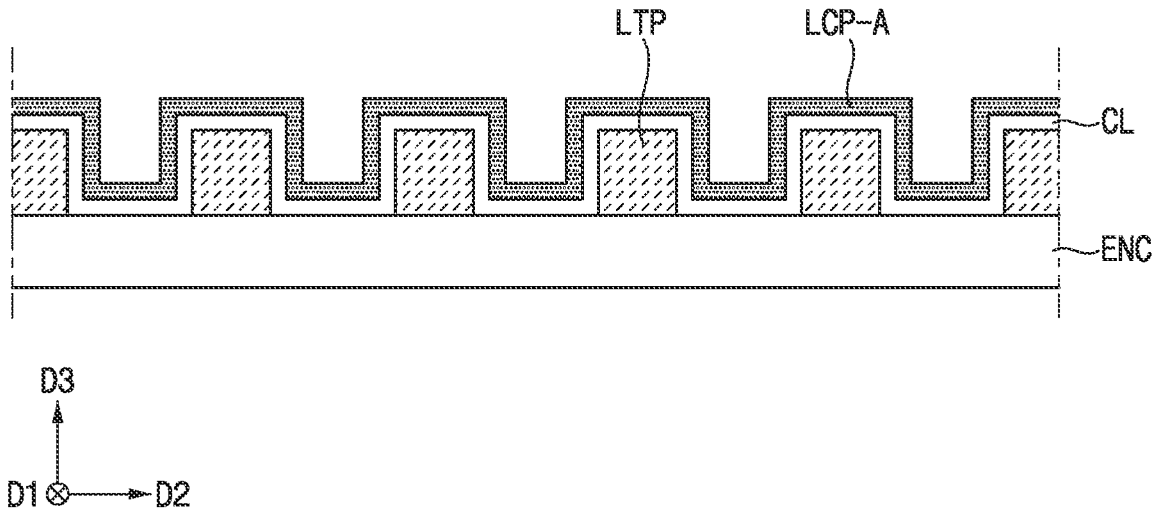

Referring to FIG. 8, a preliminary light control layer LCP-A may be provided or formed on the capping layer CL. The preliminary light control layer LCP-A may cover the capping layer CL. In an embodiment, the preliminary light control layer LCP-A may include molybdenum-tantalum oxide (MTO). In an embodiment, the preliminary light control layer LCP-A may be formed through a sputtering process.

Figure 9:
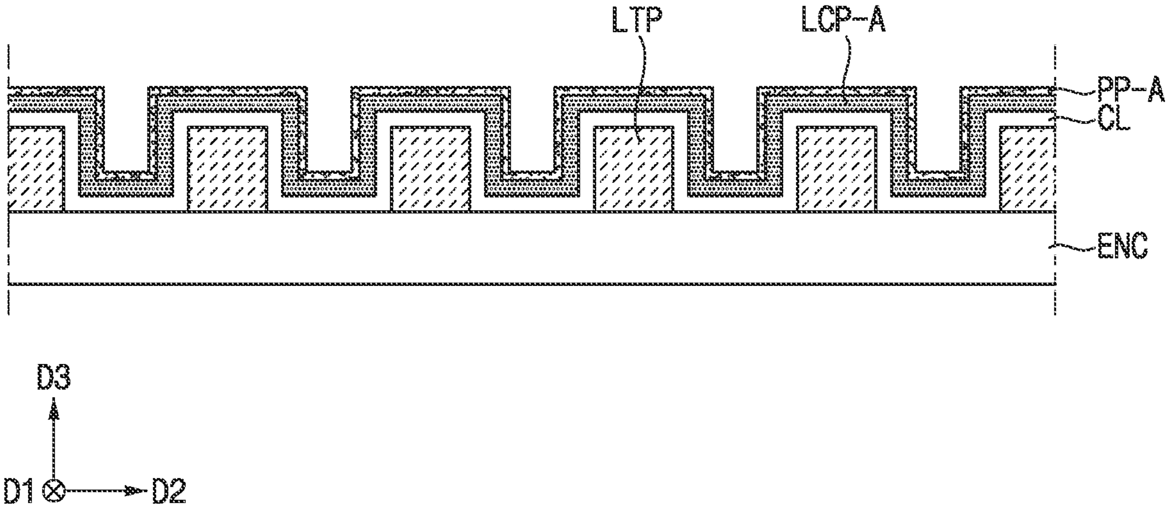

Referring to FIG. 9, a preliminary protective layer PP-A may be provided or formed on the preliminary light control layer LCP-A. The preliminary protective layer PP-A may cover the preliminary light control layer LCP-A. In an embodiment, the preliminary protective layer PP-A may be formed of a metal oxide. In an embodiment, for example, the preliminary protective layer PP-A may be formed of a transparent conductive oxide. Examples of the metal oxide that can be used as the preliminary protective layer PP-A may include indium tin oxide (ITO), indium zinc oxide (IZO), indium tin zinc oxide (ITZO), indium gallium zinc oxide (IGZO), indium zinc gallium oxide (ITGO), indium tin gallium zinc oxide (ITGZO), or the like. These may be used alone or in combination with each other. In an embodiment, the preliminary protective layer PP-A may be formed through a sputtering process.

Figure 10:
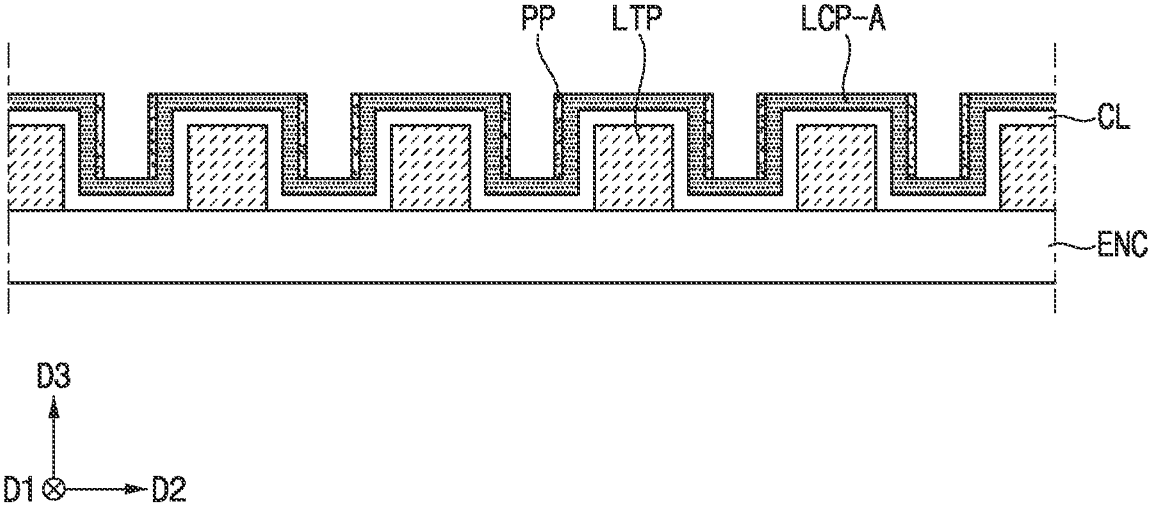

Further referring to FIG. 10, the protective patterns PP may be formed by removing a portion of the protective layer PP-A.

In an embodiment, the portion of the preliminary protective layer PP-A may be removed through an etching process. In an embodiment, for example, the portion of the preliminary protective layer PP-A may be removed through a dry etching process. In an embodiment, for example, the dry etching process may be a physical etching. In an embodiment, removing the portion of the preliminary protective layer PP-A may include etching portions of the preliminary protective layer PP-A facing in the third direction D3. That is, the portion of the preliminary protective layer PP-A may be removed through an anisotropic dry etching process.

A portion of an upper surface of the preliminary light control layer LCP-A may be exposed by removing the portion of the preliminary protective layer PP-A. That is, the protective patterns PP may be formed in the opening of the light transmission pattern LTP and may be formed to contact the side surface of the preliminary light control layer LCP-A.

Figure 11:
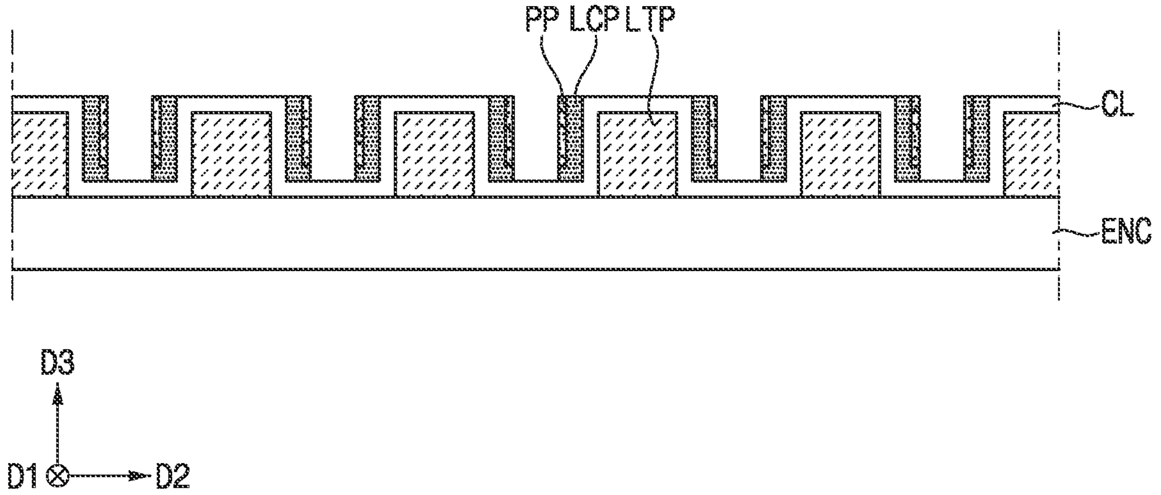

Referring to FIG. 11, the light control patterns LCP may be formed by removing a portion of the preliminary light control layer LCP-A exposed from the protective patterns PP.

In an embodiment, the portion of the preliminary light control layer LCP-A may be removed through an etching process. In an embodiment, for example, the portion of the preliminary light control layer LCP-A may be removed through a dry etching process. In an embodiment, for example, the dry etching process may be a physical etching. In an embodiment, removing a portion of the preliminary light control layer LCP-A may include etching portion of the preliminary light control layer LCP-A exposed through the protective patterns PP in the third direction D3 or not overlapping the protective patterns PP in the third direction D3. That is, the portion of the preliminary light control layer LCP-A may be removed through an anisotropic dry etching process.

The portion of the preliminary light control layer LCP-A may be removed to expose the upper surface of the light transmission pattern LTP (e.g., a portion of the upper surface of the capping layer CL). Accordingly, light emitted from the light emitting device LED of FIG. 3 may be emitted to an outside through the light transmission pattern LTP or may be emitted to the outside by passing an area between the light control patterns LCP.

In an embodiment, an etching rate of the protective patterns PP may be lower than an etching rate of the preliminary light control layer LCP-A in a same etching process. In an embodiment, for example, in a step of removing the portion of the preliminary light control layer LCP-A, the side surface of the preliminary light control layer LCP-A may be protected by protective patterns PP. Accordingly, damage to the light control patterns LCP which is remaining may be substantially reduced or effectively prevented.

In an embodiment, as shown in FIGS. 10 and 11, the portion of the preliminary protective layer PP-A and the portion of the preliminary light control layer LCP-A are sequentially removed, but the invention is not necessarily limited thereto. In an alternative embodiment, for example, the portion of the preliminary protective layer PP-A and the portion of the preliminary light control layer LCP-A may be removed together.

Figure 12:
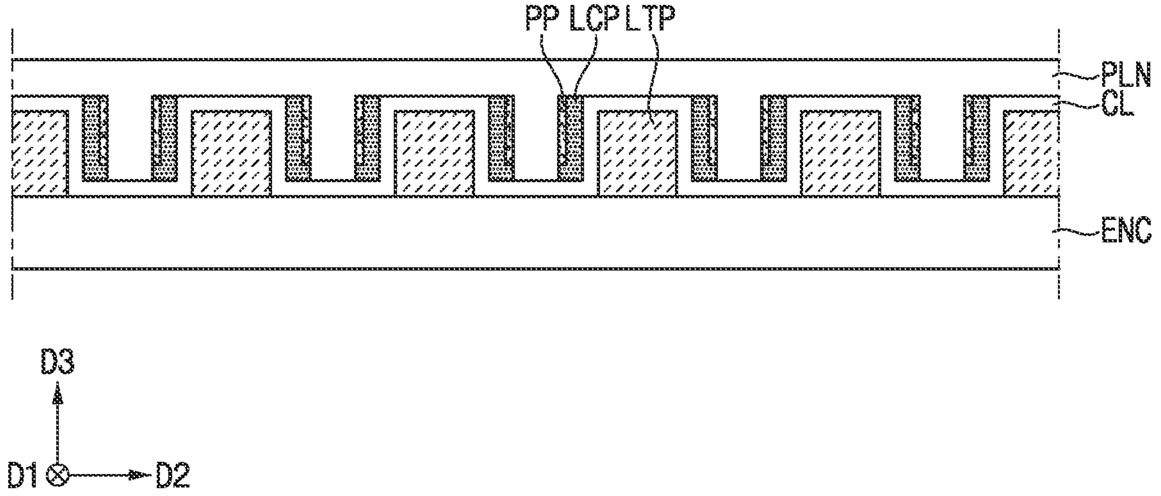

Referring to FIG. 12, the planarization layer PLN may be formed to cover the capping layer CL, the light control patterns LCP, and the protective patterns PP. In an embodiment, the planarization layer PLN may be formed to fill the empty space of the opening of the light transmission pattern LTP. In an embodiment, a height (or a distance in the third direction D3 from an upper surface of the encapsulation layer ENC) of the planarization layer PLN may be greater than a height of the light transmission pattern LTP. However, the invention is not necessarily limited thereto.

According to embodiments, before forming the light control patterns LCP, the protective patterns PP including a metal oxide may be provided or formed on the preliminary light control layer LCP-A. The protective patterns PP may be formed to contact the side surface of the preliminary light control layer LCP-A. Accordingly, in the process of forming the light control patterns LCP by removing the portion of the preliminary light control layer LCP-A, the side surface of the preliminary light control layer LCP-A may be protected by the protective patterns PP. Accordingly, damage to the light control patterns LCP which is remaining may be substantially reduced or effectively prevented. Accordingly, a reliability of the display device 10 may be improved.

Figure 13:
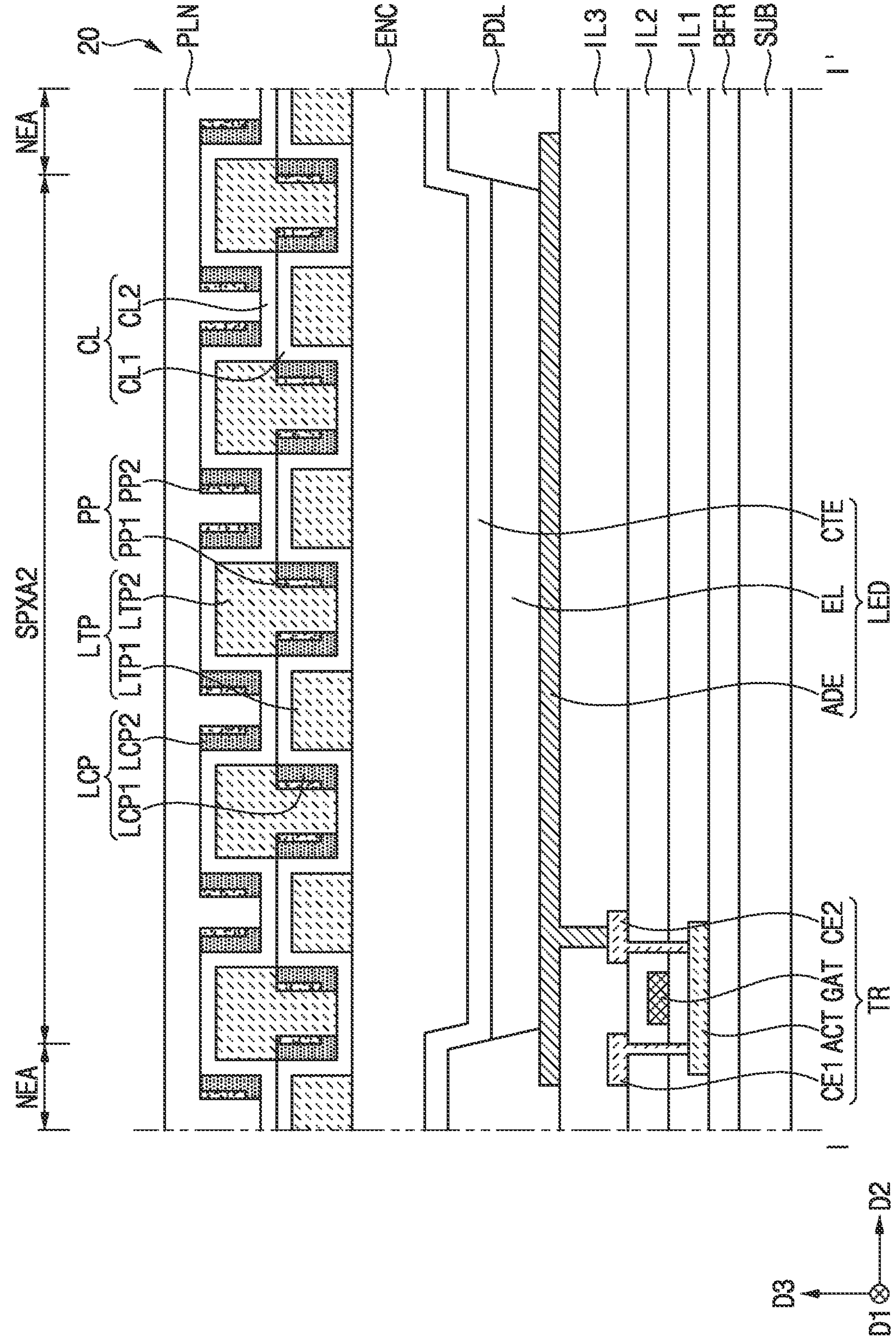
FIG. 13 is a cross-sectional view illustrating a display device according to an alternative embodiment.

FIG. 13 is a cross-sectional view illustrating a display device according to an alternative embodiment. Particularly, FIG. 13 may correspond to the cross-sectional view of FIG. 3.

The display device 20 shown in FIG. 13 may be substantially the same as or similar to the display device 10 described with reference to FIG. 3, except that the light transmission pattern LTP, the light control patterns LCP, and the protective patterns PP have multiple structures. Hereinafter, the display device 20 according to an embodiment shown in FIG. 13 will be described, focusing on differences from the display device 10 described with reference to FIG. 3.

According to an embodiment of the display device 20, as shown in FIG. 13, the light transmission pattern LTP may include a first light transmission pattern LTP1 and a second light transmission pattern LTP2. The capping layer CL may include a first capping layer CL1 and a second capping layer CL2. The light control patterns LCP may include first light control patterns LCP1 and second light control patterns LCP2. The protective patterns PP may include first protective patterns PP1 and second protective patterns PP2.

In an embodiment, the first light transmission pattern LTP1 may be disposed on the encapsulation layer ENC. The first light transmission pattern LTP1 may define a first opening exposing an upper surface of the encapsulation layer ENC. The first opening may be defined by a side surface of the first light transmission pattern LTP1. In such an embodiment, the first opening may be defined through the first light transmission pattern LTP1. In an embodiment, the first light transmission pattern LTP1 may have a grid shape in a plan view.

The first capping layer CL1 may cover the first light transmission pattern LTP1. In an embodiment, the first capping layer CL1 may cover an upper surface of the first light transmission pattern LTP1, the side surface of the first light transmission pattern LTP1, and the encapsulation layer ENC. In an embodiment, the first capping layer CL1 may include an inorganic material. Examples of inorganic material that can be used as the first capping layer CL1 may include silicon oxide, silicon nitride, silicon oxynitride, or the like. These may be used alone or in combination with each other.

The first light control patterns LCP1 may be disposed on the first capping layer CL1. The first light control patterns LCP1 may be disposed in the first opening defined in the first light transmission pattern LTP1. In an embodiment, for example, the first light control patterns LCP1 may contact a side surface of the first capping layer CL1. In such an embodiment, the first light control patterns LCP1 may overlap the side surface of the first light transmission pattern LTP1. Accordingly, the first light transmission pattern LTP1 may be disposed between the first light control patterns LCP1 adjacent to each other.

The first protective patterns PP1 may be disposed on the first light control patterns LCP1. In an embodiment, the first protective patterns PP1 may be disposed in the first opening defined in the first light transmission pattern LTP1. In an embodiment, for example, the first protective patterns PP1 may contact side surfaces of each of the first light control patterns LCP1, respectively. In an embodiment, for example, the first protective patterns PP1 may surround at least a portion of each of the first light control patterns LCP1. The first protective patterns PP1 may expose the upper surface of the first light transmission pattern LTP1.

In an embodiment, the first protective patterns PP1 may include a metal oxide. In an embodiment, for example, the first protective patterns PP1 may include a transparent conductive oxide. Examples of the metal oxide that can be used as the first protective patterns PP1 may include indium tin oxide (ITO), indium zinc oxide (IZO), indium tin zinc oxide (ITZO), indium gallium zinc oxide (IGZO), indium zinc. gallium oxide (ITGO), indium tin gallium zinc oxide (ITGZO), or the like. These may be used alone or in combination with each other.

In an embodiment, an etching rate of the first protective patterns PP1 may be lower than an etching rate of the first light control patterns LCP1 in a same etching process. In an embodiment, the etching process may be a dry etching process.

In an embodiment, the second light transmission pattern LTP2 may be disposed in the first opening of the first light transmission pattern LTP1. In such an embodiment, the second light transmission pattern LTP2 may be disposed while filling an empty space of the first opening of the first light transmission pattern LTP1. In an embodiment, the second light transmission pattern LTP2 may have a higher height than a height of the first light transmission pattern LTP1. Accordingly, some of the side surface of the second light transmission pattern LTP2 may overlap the side surface of the first light transmission pattern LTP1, and some of the side surface of the second light transmission pattern LTP2 may be spaced apart from the side surface of the first light transmission pattern LTP1. In such an embodiment, a portion of the second light transmission pattern LTP2 may be exposed from the first light transmission pattern LTP1.

The second light transmission pattern LTP2 may define a second opening exposing a portion of the upper surface of the first capping layer CL1. The second opening may be defined by a portion of the side surface of the second light transmission pattern LTP2. In an embodiment, the second light transmission pattern LTP2 may have a grid shape in a plan view.

In an embodiment, the second light transmission pattern LTP2 may include substantially the same material as the first light transmission pattern LTP1. In an embodiment, for example, the second light transmission pattern LTP2 may include an organic insulating material and/or an inorganic insulating material having relatively high light transmittance.

The second capping layer CL2 may cover the second light transmission pattern LTP2. In an embodiment, the second capping layer CL2 may cover an upper surface of the second light transmission pattern LTP2, the side surface of the second light transmission pattern LTP2, and the first capping layer CL1. In an embodiment, the second capping layer CL2 may include an inorganic material. Examples of inorganic materials that can be used as the second capping layer CL2 may include silicon oxide, silicon nitride, silicon oxynitride, or the like. These may be used alone or in combination with each other.

The second light control patterns LCP2 may be disposed on the second capping layer CL2. The second light control patterns LCP2 may be disposed in the second opening defined in the second light transmission pattern LTP2. In an embodiment, for example, the second light control patterns LCP2 may contact a side surface of the second capping layer CL2. In such an embodiment, the second light control patterns LCP2 may overlap the side surface of the second light transmission pattern LTP2. Accordingly, the second light transmission pattern LTP2 may be disposed between the second light control patterns LCP2 adjacent to each other.

The second protective patterns PP2 may be disposed on the second light control patterns LCP2. In an embodiment, the second protective patterns PP2 may be disposed in the second opening defined in the second light transmission pattern LTP2. In an embodiment, for example, the second protective patterns PP2 may contact side surfaces of each of the second light control patterns LCP2, respectively. In an embodiment, for example, the second protective patterns PP2 may surround at least a portion of each of the second light control patterns LCP2. The second protective patterns PP may expose the upper surface of the second light transmission pattern LTP2.

In an embodiment, the second protective patterns PP2 may include a metal oxide. In an embodiment, for example, the second protective patterns PP2 may include a transparent conductive oxide. Examples of the metal oxide that can be used as the second protective patterns PP2 may include indium tin oxide (ITO), indium zinc oxide (IZO), indium tin zinc oxide (ITZO), indium gallium zinc oxide (IGZO), indium zinc gallium oxide (ITGO), indium tin gallium zinc oxide (ITGZO). These may be used alone or in combination with each other.

The planarization layer PLN may cover the second light transmission pattern LTP2, the second light control patterns LTP2, the second protective patterns PP2, and the second capping layer CL2. The planarization layer PLN may have a substantially flat upper surface. The planarization layer PLN may be disposed while filling an empty space of the second opening of the second light transmission pattern LTP2.

FIGS. 14 to 21 are cross-sectional views illustrating an embodiment of a method of manufacturing a first light transmission pattern, a second light transmission pattern, first light control patterns, second light control patterns, first protective patterns, and second protective patterns included in the display device of FIG. 13.

Figure 14:
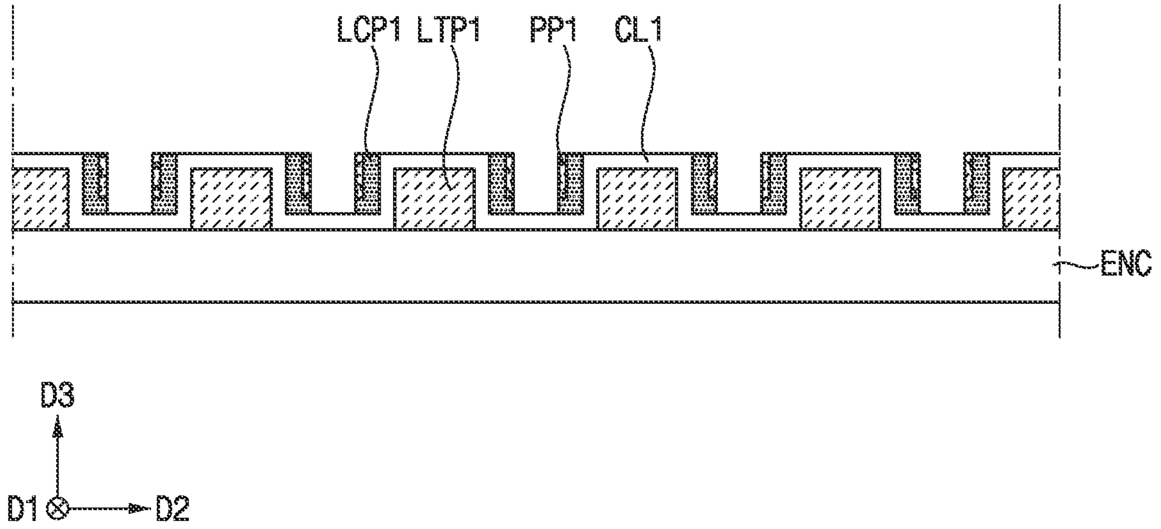
FIGS. 14 to 21 are cross-sectional views illustrating an embodiment of a method of manufacturing a first light transmission pattern, a second light transmission pattern, first light control patterns, second light control patterns, first protective patterns, and second protective patterns included in the display device of FIG. 13.

Referring to FIG. 14, the first light transmission pattern LTP1, the first capping layer CL1, the first light control patterns LCP1, and the first protective patterns PP1 may be provided or formed on the encapsulation layer ENC. A process of forming the first light transmission pattern LTP1, the first capping layer CL1, the first light control patterns LCP1, and the first protective patterns PP1 on the encapsulation layer ENC may be substantially the same as the process of forming the light transmission pattern LTP, the capping layer CL, the light control patterns LCP, and the protective patterns PP described with reference to FIGS. 5 to 11.

In an embodiment, for example, the first light transmission pattern LTP1 defining the first opening may be formed by patterning a first preliminary light transmission layer. Thereafter, the first capping layer CL1 covering the first light transmission pattern LTP1 may be formed. Thereafter, a preliminary first light control layer covering the first capping layer CL1 and a preliminary first protective layer covering the preliminary first light control layer may be formed. Thereafter, the first protective patterns PP1 may be formed by removing a portion of the preliminary first protective layer. Thereafter, the first light control patterns LCP1 may be formed by removing a portion of the first preliminary light control layer exposed from the first protective patterns PP1. Accordingly, the first light control patterns LCP1 may be formed to contact the side surface of the first capping layer CL1, and the first protective patterns PP1 may be formed to contact the side surfaces of each of the first light control patterns LCP1, respectively.

Figure 15:
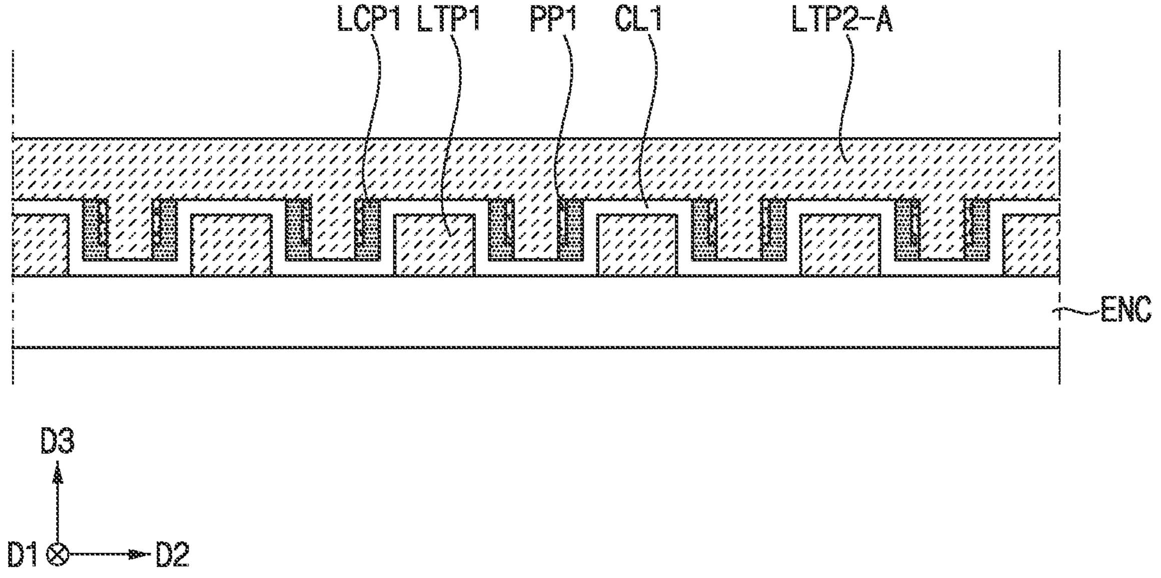

Referring to FIG. 15, a second preliminary light transmission layer LTP2-A may be provided or formed on the first capping layer CL1, the first light control patterns LCP1, and the first protective patterns PP1. The second preliminary light transmission layer LTP2-A may cover the first capping layer CL1, the first light control patterns LCP1, and the first protective patterns PP1. In an embodiment, for example, the second preliminary light transmission layer LTP2-A may be formed to fill an empty space of the first opening. The second preliminary light transmitting layer LTP2-A may include an organic insulating material and/or an inorganic insulating material having relatively high light transmittance.

Figure 16:
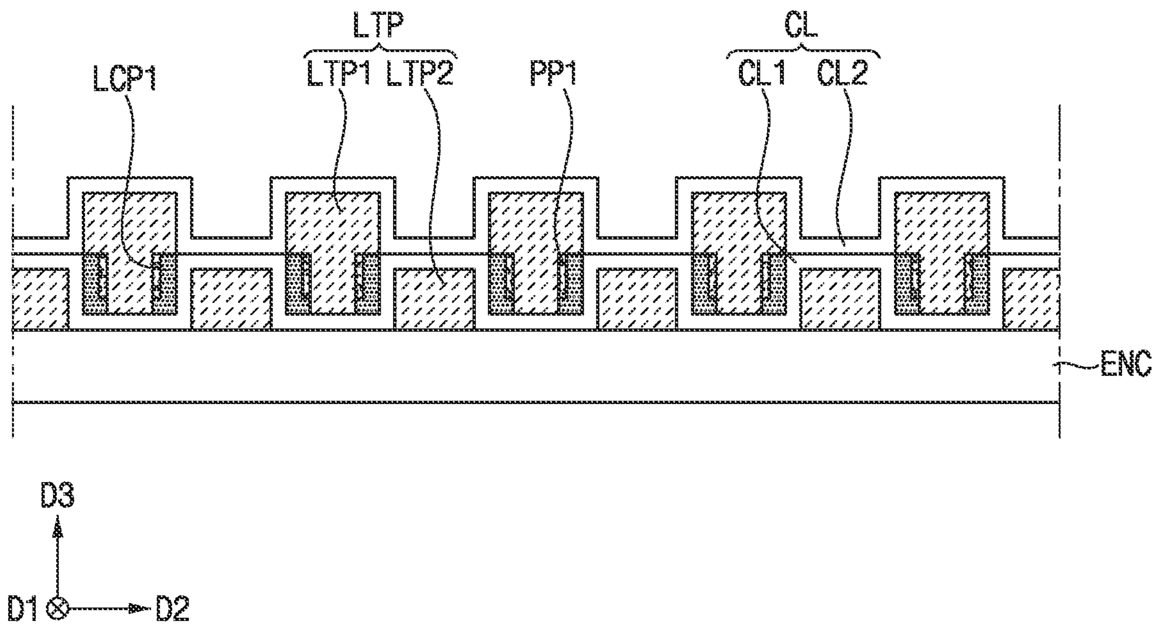

Further referring to FIG. 16, the second preliminary light transmission pattern LTP2 may be formed by patterning the second preliminary light transmission layer LTP2-A through exposure and development processes. The second preliminary light transmission pattern LTP2 may define the second opening exposing a portion of the upper surface of the first capping layer CL1. The second opening may be defined by the side surface of the second light transmission pattern LTP2.

Subsequently, the second capping layer CL2 may be provided or formed on the second light transmission pattern LTP2. The second capping layer CL2 may cover the second light transmission pattern LTP2. The second capping layer CL2 may be formed of at least one selected from silicon oxide, silicon nitride, and silicon oxynitride.

Figure 17:
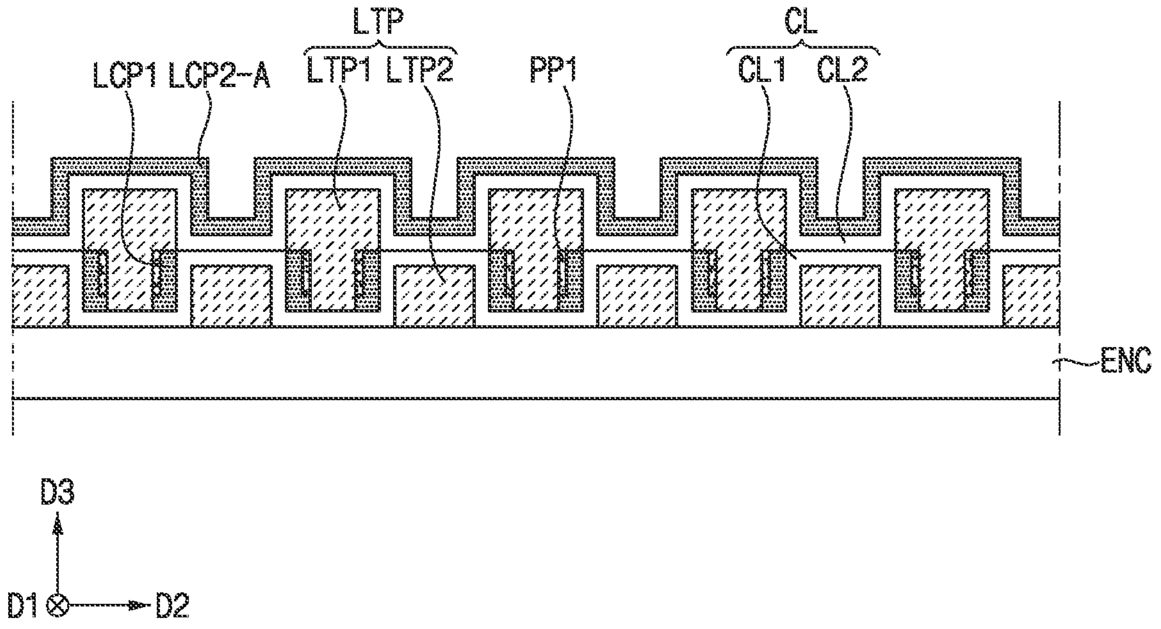

Referring to FIG. 17, a second preliminary light control layer LCP2-A may be provided or formed on the second capping layer CL2. The second preliminary light control layer LCP2-A may cover the second capping layer CL2. The second preliminary light control layer LCP2-A may include molybdenum-tantalum oxide (MTO). In an embodiment, the preliminary light control layer LCP-A may be formed through a sputtering process.

Figure 18:
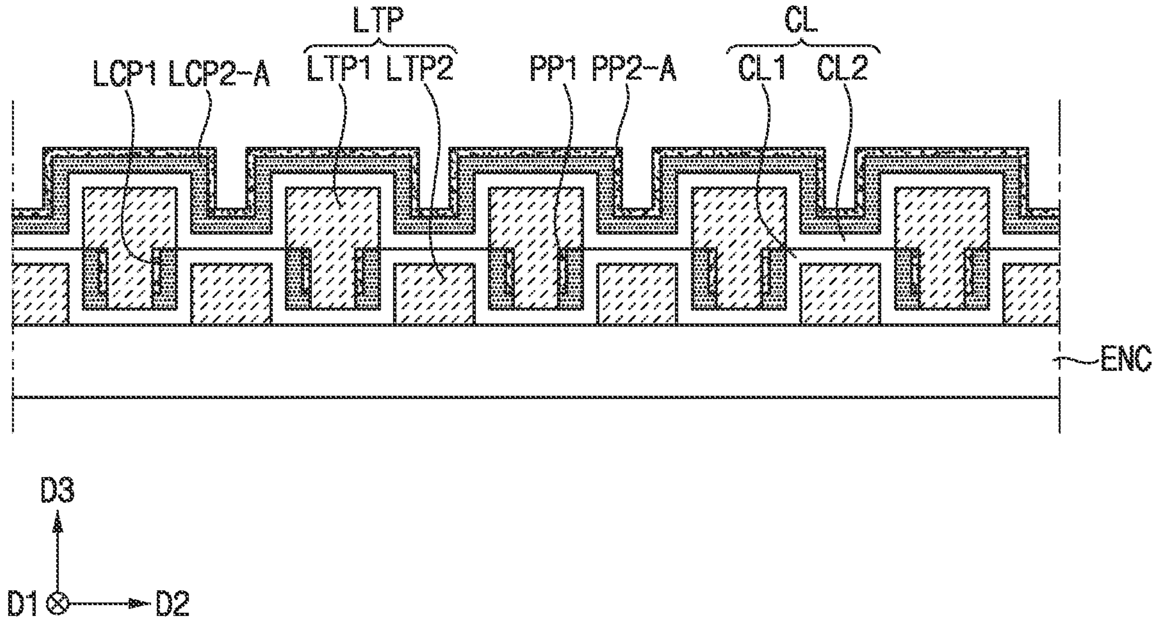

Referring to FIG. 18, a second preliminary protective layer PP2-A may be provided or formed on the second preliminary light control layer LCP2-A. The second preliminary protective layer PP2-A may cover the second preliminary light control layer LCP2-A. In an embodiment, the second preliminary protective layer PP2-A may be formed of a metal oxide. In an embodiment, for example, the second preliminary protective layer PP2-A may be formed of a transparent conductive oxide. Examples of the metal oxide that can be used as the second preliminary protective layer PP2-A may include indium tin oxide (ITO), indium zinc oxide (IZO), indium tin zinc oxide (ITZO), and indium gallium zinc oxide (IGZO), indium zinc gallium oxide (ITGO), and indium tin gallium zinc oxide (ITGZO). These may be used alone or in combination with each other. In an embodiment, the second preliminary protective layer PP2-A may be formed through a sputtering process.

Figure 19:
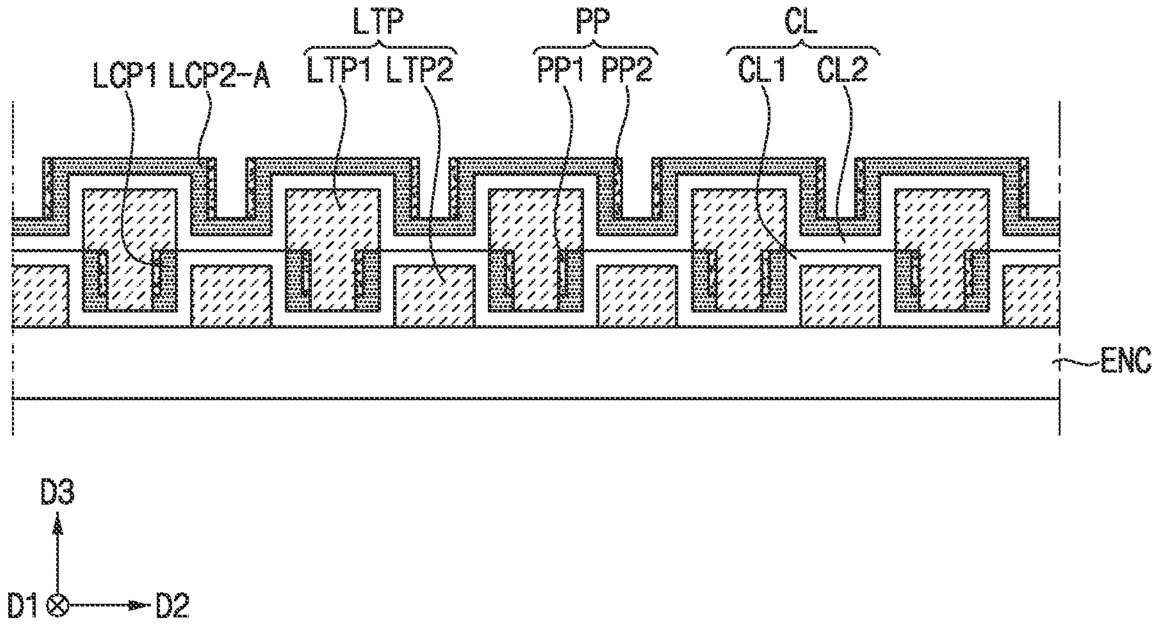

Further referring to FIG. 19, the second protective patterns PP may be formed by removing a portion of the second preliminary protective layer PP2-A.

In an embodiment, the portion of the second preliminary protective layer PP2-A may be removed through an etching process. In an embodiment, for example, the portion of the second preliminary protective layer PP2-A may be removed through a dry etching process. In an embodiment, for example, the dry etching process may be a physical etching. In an embodiment, removing the portion of the second preliminary protective layer PP2-A may include etching portions of the second preliminary protective layer PP2-A facing in the third direction D3. That is, the portion of the second preliminary protective layer PP2-A may be removed through an anisotropic dry etching process.

A portion of an upper surface of the second preliminary light control layer LCP2-A may be exposed by removing the portion of the second preliminary protective layer PP2-A. That is, the second protective patterns PP2 may be formed in the second opening of the second light transmission pattern LTP2 and may be formed to contact a side surface of the second preliminary light control layer LCP2-A.

Figure 20:
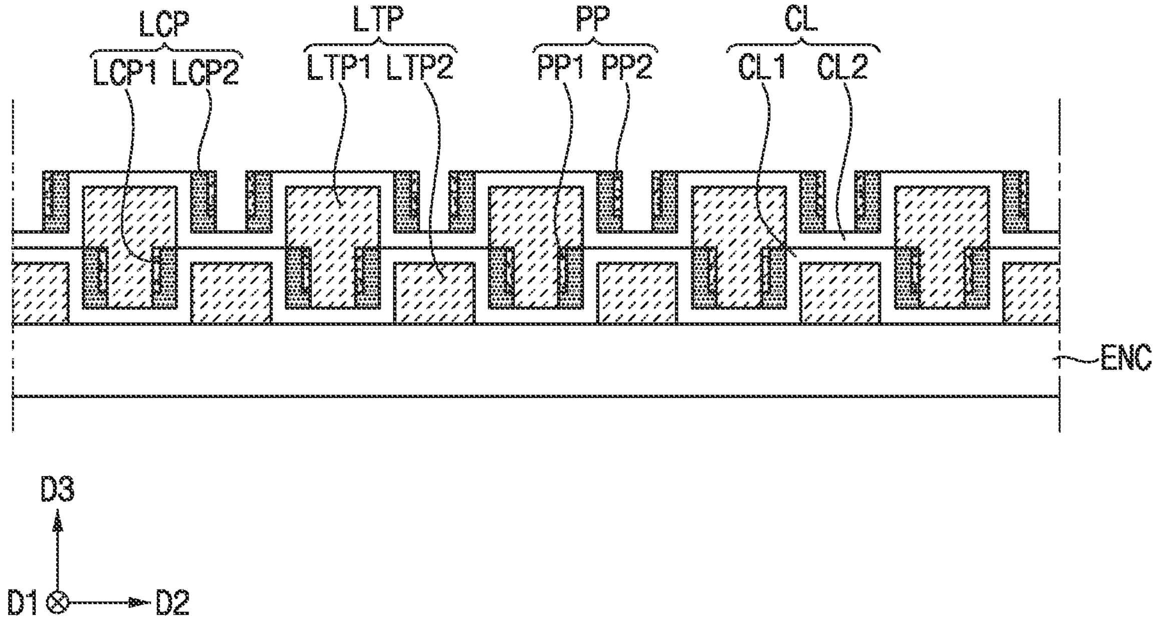

Referring to FIG. 20, the second light control patterns LCP2 may be formed by removing a portion of the second preliminary light control layer LCP2-A exposed through the second protective patterns PP2 or not overlapping the second protective patterns PP2 in the third direction D3.

In an embodiment, the portion of the second preliminary light control layer LCP2-A may be removed through an etching process. In an embodiment, for example, the portion of the second preliminary light control layer LCP2-A may be removed through a dry etching process. In an embodiment, for example, the dry etching process may be a physical etching. In an embodiment, removing the portion of the second preliminary light control layer LCP2-A may include etching the second preliminary light control layer LCP2-A facing in the third direction D3. That is, the portion of the second preliminary light control layer LCP2-A may be removed through an anisotropic dry etching process.

The portion of the second preliminary light control layer LCP2-A may be removed to expose the upper surface of the second light transmission pattern LTP2 (e.g., a portion of an upper surface of the second capping layer CL2). Accordingly, light emitted from the light emitting device LED of FIG. 13 may be emitted to outside through the second light transmission pattern LTP2 or may be emitted to the outside by passing an area between the second light control patterns LCP2.

In an embodiment, an etching rate of the second protective patterns PP2 may be lower than an etching rate of the second preliminary light control layer LCP2-A in a same etching process. In an embodiment, for example, in the process of forming the second light control patterns LCP2 by removing the portion of the second preliminary light control layer LCP2-A, the side surface of the second preliminary light control layer LCP2-A may be protected by the second protective patterns PP2. Accordingly, damage to the second light control patterns LCP2 which is remaining may be substantially reduced or effectively prevented.

In an embodiment, as shown in FIGS. 19 and 20, the portion of the second preliminary protective layer PP2-A and the portion of the second preliminary light control layer LCP2-A are sequentially removed, but the invention is not necessarily limited thereto. In an alternative embodiment, for example, the portion of the second preliminary protective layer PP2-A and the portion of the second preliminary light control layer LCP2-A may be removed together.

Figure 21:
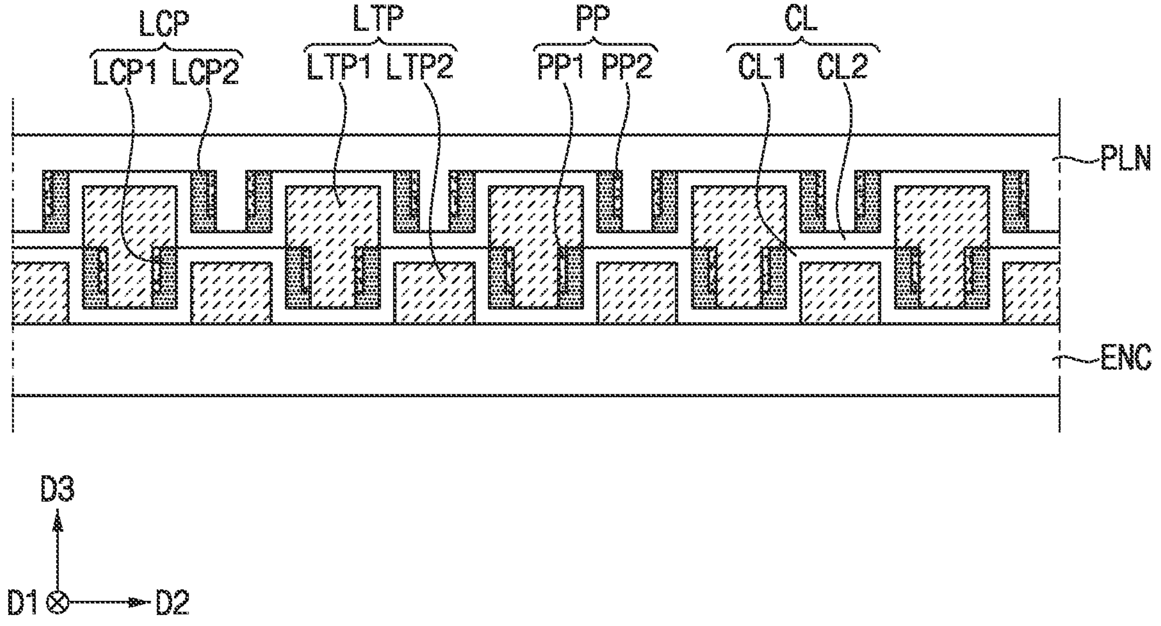

Referring to FIG. 21, the planarization layer PLN may be formed to cover the second capping layer CL2, the second light control patterns LCP2, and the second protective patterns PP2. In such an embodiment, the planarization layer PLN may be formed to fill the empty space of the second opening of the second light transmission pattern LTP. In an embodiment, a height of the planarization layer PLN may be greater than a height of the second light transmission pattern LTP2. However, the invention is not necessarily limited thereto.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
 a substrate on which an encapsulation layer is disposed;
 a light transmission pattern disposed on the encapsulation layer, the light transmission pattern defining an opening exposing an upper surface of the encapsulation layer, the opening being defined by a side surface of the light transmission pattern;
 a capping layer covering the light transmission pattern;
 light control patterns disposed on the capping layer and contacting a side surface of the capping layer, the light control patterns being disposed in the opening defined in the light transmission pattern and overlapping the side surface of the light transmission pattern such that the light transmission pattern is disposed between the light control patterns adjacent to each other; and
 protective patterns contacting side surfaces of each of the light control patterns, respectively, and including a metal oxide.

2. The display device of claim 1, wherein the metal oxide of the protective patterns is a transparent conductive oxide.

3. The display device of claim 1, wherein the metal oxide of the protective patterns is at least one selected from indium tin oxide (ITO), indium zinc oxide (IZO), indium tin zinc oxide (ITZO), indium gallium zinc oxide (IGZO), indium zinc gallium oxide (ITGO), and indium tin gallium zinc oxide (ITGZO).

4. The display device of claim 1, wherein a width of each of the protective patterns is less than a width of each of the light control patterns.

5. The display device of claim 4, wherein the protective patterns have a width in a range of about 100 angstroms to about 1000 angstroms.

6. The display device of claim 1, wherein the protective patterns expose an upper surface of the light transmission pattern.

7. The display device of claim 1, wherein an etching rate of the protective patterns is lower than an etching rate of the light control patterns in a same etching process.

8. The display device of claim 1, wherein the capping layer includes at least one selected from silicon oxide, silicon nitride, and silicon oxynitride.

9. The display device of claim 1, wherein the light control patterns include molybdenum-tantalum oxide (MTO).

10. The display device of claim 1, wherein the light control patterns have a multi-layer structure of MTO/Mo, MTO/Cu, MTO/Al, MTO/Mo/MTO, MTO/Cu/MTO, or MTO/Al/MTO.

11. The display device of claim 1,
 wherein the light transmission pattern includes:
  a first light transmission pattern; and
  a second light transmission pattern disposed adjacent to the first light transmission pattern and having a height greater than a height of the first light transmission pattern, and
 wherein the capping layer includes:
  a first capping layer covering the first light transmission pattern; and
  a second capping layer covering a portion of the second light transmission pattern exposed through the first light transmission pattern.

12. The display device of claim 11, wherein the light control patterns includes:
 first light control patterns disposed on the first capping layer and contacting a side surface of the first capping layer; and
 second light control patterns disposed on the second capping layer and contacting a side surface of the second capping layer.

13. The display device of claim 12, wherein the protective patterns include:
 first protective patterns contacting side surfaces of the first light control patterns, respectively; and
 second protective patterns contacting side surfaces of the second light control patterns, respectively.

14. The display device of claim 13, wherein the first protective patterns expose an upper surface of the first light transmission pattern, and
 wherein the second protective patterns expose an upper surface of the second light transmission pattern.

15. The display device of claim 11, wherein a taper angle of the first light transmission pattern with respect to the substrate is in a range of about 60 degrees to about 90 degrees.

16. The display device of claim 15, further comprising:
 light emitting devices disposed on the substrate; and
 the encapsulation layer covering the light emitting devices, and
 wherein the light transmission pattern, the capping layer, the light control patterns, and the protective patterns are disposed on the encapsulation layer.

17. A display device comprising:
 a substrate on which an encapsulation layer is disposed;
 a light transmission pattern disposed on the encapsulation layer, the light transmission pattern defining an opening exposing an upper surface of the encapsulation layer, the opening being defined by a side surface of the light transmission pattern;
 light control patterns disposed in the opening defined in the light transmission pattern and overlapping the side surface of the light transmission such that the light transmission pattern is disposed between the light control patterns adjacent to each other; and
 protective patterns contacting side surfaces of each of the light control patterns, respectively,
 wherein the protective patterns includes at least one metal oxide selected from indium tin oxide (ITO), indium zinc oxide (IZO), indium tin zinc oxide (ITZO), indium gallium zinc oxide (IGZO), indium zinc gallium oxide (ITGO) and indium tin gallium zinc oxide (ITGZO).

18. The display device of claim 17, wherein the light control patterns and the protective patterns expose an upper surface of the light transmission pattern.

19. The display device of claim 17, wherein a width of each of the protective patterns is less than a width of each of the light control patterns.

* * * * *